US011508819B2

(12) United States Patent
Bobde et al.

(10) Patent No.: US 11,508,819 B2
(45) Date of Patent: Nov. 22, 2022

(54) METHOD FOR FORMING SUPER-JUNCTION CORNER AND TERMINATION STRUCTURE WITH GRADED SIDEWALLS

(71) Applicant: Alpha and Omega Semiconductor (Cayman) Ltd., Grand Cayman (KY)

(72) Inventors: Madhur Bobde, Santa Clara, CA (US); Karthik Padmanabhan, San Jose, CA (US); Lingpeng Guan, San Jose, CA (US)

(73) Assignee: Alpha and Omega Semiconductor (Cayman) Ltd., Grand Cayman (KY)

(*) Notice: Subject to any disclaimer, the term of this patent is extended or adjusted under 35 U.S.C. 154(b) by 0 days.

(21) Appl. No.: 17/313,998

(22) Filed: May 6, 2021

(65) Prior Publication Data
US 2021/0257461 A1    Aug. 19, 2021

Related U.S. Application Data

(63) Continuation of application No. 16/752,142, filed on Jan. 24, 2020, now Pat. No. 11,038,022, which is a
(Continued)

(51) Int. Cl.
*H01L 29/78* (2006.01)
*H01L 29/06* (2006.01)
*H01L 29/66* (2006.01)
*H01L 29/15* (2006.01)
*H01L 29/08* (2006.01)

(52) U.S. Cl.
CPC ........ *H01L 29/157* (2013.01); *H01L 29/0619* (2013.01); *H01L 29/0696* (2013.01);
(Continued)

(58) Field of Classification Search
CPC ............... H01L 29/157; H01L 29/0619; H01L 29/0696; H01L 29/0878; H01L 29/0886;
(Continued)

(56) References Cited

U.S. PATENT DOCUMENTS 6,097,063 A    8/2000 Fujihira
7,002,205 B2   2/2006 Onishi et al.
(Continued)

OTHER PUBLICATIONS

Y. Oonishi, A. Ooi, T. Shimatou, "Superjunction MOSFET," Fuji Electric Review, vol. 56, No. 2, pp. 65-68, 2010.
(Continued)

*Primary Examiner* — David Vu

(57) ABSTRACT

A method for forming a superjunction power semiconductor device includes forming multiple epitaxial layers of a first conductivity type on a semiconductor substrate and implanting dopants of a second conductivity type into each epitaxial layer to form a first group of implanted regions in a first region and a second group of implanted regions in a second region in each epitaxial layer. The multiple epitaxial layers are annealed to form multiple columns of the second conductivity type having slanted sidewalls across the first to last epitaxial layers. The columns include a first group of columns formed by the implanted regions of the first group and having a first grading and a second group of columns formed by the implanted regions of the second group and having a second grading, where the second grading is less than the first grading.

11 Claims, 7 Drawing Sheets

Related U.S. Application Data continuation of application No. 15/937,674, filed on Mar. 27, 2018, now Pat. No. 10,580,868.

(52) U.S. Cl.
CPC ...... *H01L 29/0878* (2013.01); *H01L 29/0886* (2013.01); *H01L 29/158* (2013.01)

(58) Field of Classification Search
CPC .............. H01L 29/158; H01L 29/66712; H01L 29/7811; H01L 29/0634; H01L 29/7802; H01L 29/0603; H01L 29/0611; H01L 29/0684

See application file for complete search history.

(56) References Cited

U.S. PATENT DOCUMENTS

| | | |
|---|---|---|
| 8,476,698 B2 | 7/2013 | Guan et al. |
| 8,680,613 B2 | 3/2014 | Guan et al. |
| 8,829,640 B2 | 9/2014 | Bobde et al. |
| 9,224,852 B2 | 12/2015 | Guan et al. |
| 9,231,050 B1 | 1/2016 | Bobde et al. |
| 2007/0272977 A1 | 11/2007 | Saito et al. |
| 2008/0246085 A1 | 10/2008 | Saito et al. |
| 2012/0273871 A1* | 11/2012 | Yedinak .............. H01L 29/7813 257/329 |
| 2013/0248986 A1 | 9/2013 | Liu |
| 2014/0159152 A1 | 6/2014 | Kim |

OTHER PUBLICATIONS

Y. Onishi, S. Iwamoto, T. Sato, T. Nagaoka, K. Ueno, T. Fujihira, "24 mOmegacm2 680 V silicon supeijunction MOSFET," Power Semiconductor Devices and ICs, 2002. Proceedings of the 14th International Symposium on , vol. No., pp. 241,244, 2002.

T. Fujihira, "Theory of Semiconductor Superjunction Devices" (Japan Journal of Applied Physics vol. 36, Oct. 1997, pp. 6254-6262).

\* cited by examiner

US 11,508,819 B2

METHOD FOR FORMING SUPER-JUNCTION CORNER AND TERMINATION STRUCTURE WITH GRADED SIDEWALLS

CROSS REFERENCE TO OTHER APPLICATIONS

This application is a continuation of U.S. patent application Ser. No. 16/752,142, entitled SUPER-JUNCTION CORNER AND TERMINATION STRUCTURE WITH GRADED SIDEWALLS, filed Jan. 24, 2020, now U.S. Pat. No. 11,038,022, issued Jun. 15, 2021, which is a continuation of U.S. patent application Ser. No. 15/937,674, entitled SUPER-JUNCTION CORNER AND TERMINATION STRUCTURE WITH IMPROVED BREAKDOWN AND ROBUSTNESS, filed Mar. 27, 2018, now U.S. Pat. No. 10,580,868, issued Mar. 3, 2020, which patents and patent applications are incorporated herein by reference for all purposes.

FIELD OF THE INVENTION

The invention relates to power semiconductor devices and, in particular, to corner and termination structures for power semiconductor devices incorporating superjunction structures.

BACKGROUND OF THE INVENTION

Semiconductor devices incorporating superjunction structure to achieve improved electrical characteristics are known. For example, metal oxide semiconductor field effect transistor (MOSFET) devices can be incorporated with vertical or horizontal superjunction structure to optimize the on-resistance and the breakdown voltage characteristics of the transistor. As an example, Fujihira describes configurations of the lateral and vertical superjunction devices in the paper entitled "Theory of Semiconductor Superjunction Devices" (Japan Journal of Applied Physics Vol. 36, October 1997, pp. 6254-6262).

More specifically, superjunction transistors provide a way to achieve low on-resistance (Rds-on), while maintaining a high off-state breakdown voltage (BV). Superjunction devices include alternating P-type and N-type doped columns formed in the drift region. In the OFF-state of the MOSFET, the columns are completely depleted at relatively low voltage and thus can sustain a high breakdown voltage. For example, for a vertical superjunction structure, the columns deplete laterally, so that the entire p and n columns are depleted. For a superjunction device, the on-resistance Rds-on increases in direct proportion to the breakdown voltage BV, which is a much less dramatic increase as compared to the conventional semiconductor structure. A superjunction device may therefore have significantly lower on-resistance Rds-on than a conventional MOSFET device for the same high breakdown voltage. Conversely, a superjunction device may have a significantly higher BV than a conventional MOSFET for a given on-resistance Rds-on.

Example superjunction devices are described in various U.S. patents and literatures. FIG. 1 duplicates FIG. 29 of U.S. Pat. No. 7,002,205 which illustrates the cross-sectional view of part of an active cell portion of an exemplary superjunction device. Referring to FIG. 1, a vertical MOSFET device (e.g., an N-channel MOSFET) is formed on a suitably doped (e.g., N+) substrate 11, which acts as a drain region with a drain contact 18. A suitably-doped semiconductor layer (e.g., an N-Epitaxial layer) is formed on top of the substrate 11. The MOSFET device also includes a P-body region 13, an N+ source region 14, and an N+ polysilicon gate region 16, separated from the N-Epitaxial layer and the body region by a gate oxide layer 15. The MOSFET device also includes a gate contact (not shown) and a source metal 17. The source metal 27 connects electrically to the source region 14 and a heavily doped P+ body contact region 19. A superjunction structure 22 is formed in the N-Epitaxial layer and includes alternating, charge balanced P-type columns 22b and N-type columns 22a. The P-type and N-type columns are completely depleted horizontally at a low voltage and so are able to withstand a high breakdown voltage in the vertical direction. In some example, the P-type columns 22b maybe formed by implantation of P-type dopants into the N-type Epitaxial layer and the N-type columns 22a may be formed by portions of the N-type epitaxial layer that are situated adjacent to the P-type columns 22b.

In a power semiconductor device, termination techniques are employed to mitigate the high electrical field that may develop at the end or the termination of the active cell regions of the semiconductor device. A power semiconductor device includes a core region in which active transistor cells are formed and a termination region that encircles the core region. The termination region typically includes edge termination regions and corner regions. In a superjunction power semiconductor device, charge needs to be balanced everywhere, including the corner and termination regions. In the core region, the P columns can be arranged in uniform parallel rows, making it simple to achieve the charge balance. However, at the edge termination regions and the corner regions, it is more difficult to achieve charge balance. In particular, in the core region, the charge balance is two-dimensional as the P and N columns are formed in parallel rows. However, in the corner region, the charge balance becomes three-dimensional because of the curvature of the curved P and N columns. When charge balance is not maintained, the breakdown voltage (BV) of the semiconductor device decreases and the device becomes less robust. Maintaining charge balance in the termination region at the corners or edges of the power semiconductor device remains challenging.

BRIEF DESCRIPTION OF THE DRAWINGS

Various embodiments of the invention are disclosed in the following detailed description and the accompanying drawings.

DETAILED DESCRIPTION

Figure 1:
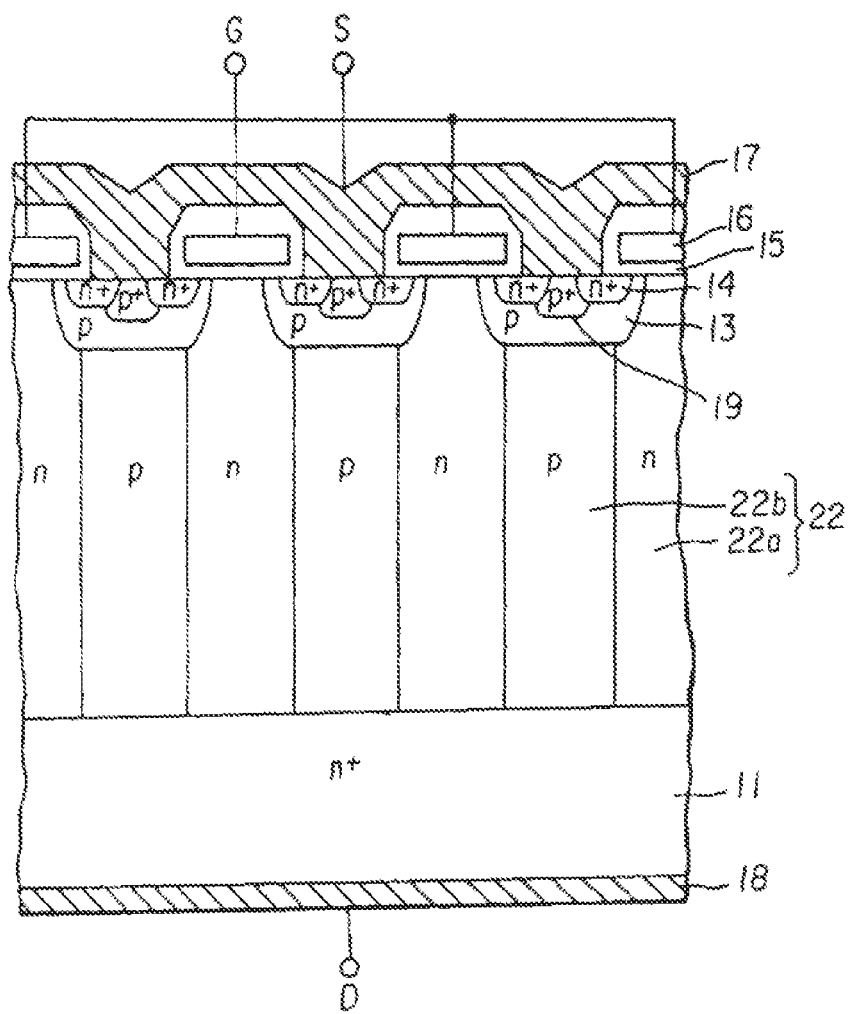
FIG. 1 duplicates FIG. 29 of U.S. Pat. No. 7,002,205 which illustrates the cross-sectional view of part of an active cell portion of an exemplary superjunction device.

The invention can be implemented in numerous ways, including as a process; an apparatus; a system; and/or a composition of matter. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

According to embodiments of the present invention, a superjunction power semiconductor device includes a termination region with superjunction structures having higher breakdown voltage than the breakdown voltage of the active cell region. In one embodiment, the termination region includes superjunction structures having lower column charge as compared to the superjunction structures formed in the active cell region (or "core region"). The lowered column charge increases the breakdown voltage that can be withstand by the termination region. As a result, the breakdown characteristic of the power semiconductor device is determined by the breakdown voltage of the core region. The power semiconductor device is made more robust by ensuring any breakdown occurs in the core region as opposed to the termination region. Furthermore, reduction in the column charge allows more tolerance for charge imbalance, thereby increasing the manufacturing process window for the power semiconductor device to improve the manufacturing yield of the power semiconductor device.

In other embodiments, a superjunction power semiconductor device incorporating superjunction structures with slanted sidewalls where the grading of the superjunction columns in the termination region is reduced as compared to the column grading in the active cell region. The breakdown voltage of the termination region is therefore increased as compared to the active cell region and the breakdown characteristic of the power semiconductor device is determined by the breakdown voltage of the core region. The power semiconductor device is made more robust by ensuring any breakdown occurs in the core region as opposed to the termination region. The manufacturing process window for the power semiconductor device is also enhanced to improve the manufacturing yield of the power semiconductor device.

In the present description, a superjunction structure refers to a semiconductor device structure including a thin semiconductor region of a first conductivity type functioning as a conduction channel of the semiconductor device and is bordered or sandwiched by thin semiconductor regions of a second, opposite conductivity type to form a balanced space charge region for enhancing the breakdown voltage characteristic of the semiconductor device. In some applications, the superjunction structure includes multiple thin semiconductor regions of alternating conductivity types formed laterally or vertically. That is, a superjunction structure includes alternating thin N-type semiconductor regions and thin P-type semiconductor regions that may be formed laterally or vertically. The multiple thin semiconductor regions of alternating N and P conductivity types are sometimes referred to herein as superjunction layers or superjunction columns. In the present description, a lateral superjunction structure includes superjunction layers that extend substantially laterally in the semiconductor chip, that is, substantially in parallel with the major surfaces of the semiconductor chip. Accordingly, current flows in the lateral superjunction structure in a lateral direction through the superjunction layers or in parallel to the major surface of the semiconductor chip. On the other hand, a vertical superjunction structure includes superjunction columns that extend substantially vertically in the semiconductor chip, that is, substantially perpendicular with the major surfaces of the semiconductor chip. Accordingly, current flows in the vertical superjunction structure in a vertical direction through the superjunction columns or perpendicular to the semiconductor chip.

Figure 2:
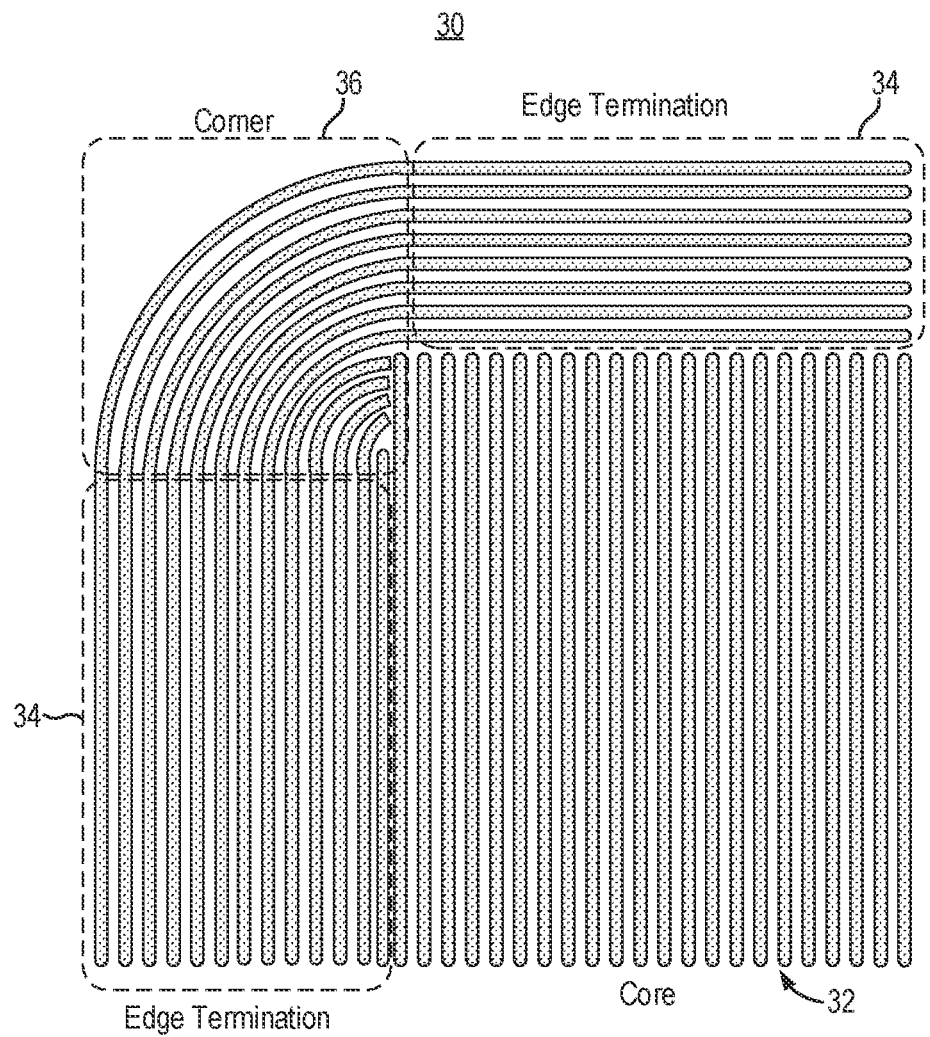
FIG. 2 illustrates the top view of a portion of a power semiconductor device incorporating superjunction structures in some embodiments.

A power semiconductor device incorporates termination structures to manage the high electrical field that may develop at the end or the termination of the active cell regions of the semiconductor device. FIG. 2 illustrates the top view of a portion of a power semiconductor device incorporating superjunction structures in some embodiments. A power semiconductor device 30 formed as a monolithic integrated circuit includes a core region 32 in which the active transistor cells are formed and a termination region in which inactive termination cells are formed. The core region is sometimes referred to as the "active cell region." The termination region encircles the core region 32 and extends toward the edge or street of the integrated circuit die. Typically, the termination region includes edge termination regions 34 and corner regions 36. A termination structure for a superjunction semiconductor device is commonly made of further P columns which are laid out in a pattern that extends toward the edge of the die. In particular, the P columns are formed as parallel columns in the edge termination regions 34 and as curved columns in the corner regions 36. Curved termination design is used in the corner region to improve the breakdown voltage (BV) by reducing the electric field. For example, a radius corner of about 150-200 mm may be applied.

In a superjunction power semiconductor device, such as power semiconductor device 30, charge needs to be balanced everywhere, including the corner and edge termination regions. In the core region, the P columns are typically arranged in uniform parallel rows, making it relatively simple to achieve the charge balance. However, at the edge termination regions and the corner regions, it is more difficult to achieve charge balance. In particular, in the core region, the charge balance is two-dimensional as the P and N columns are formed in parallel rows. The edge termination region can be treated using two-dimensional charge balance as the P and N columns remain primarily in parallel rows. However, in the corner region, the charge balance becomes three-dimensional because of the curvature of the curved P and N columns. When charge balance is not maintained, the breakdown voltage of the power semiconductor device decreases, and the device becomes less robust.

Figure 3:
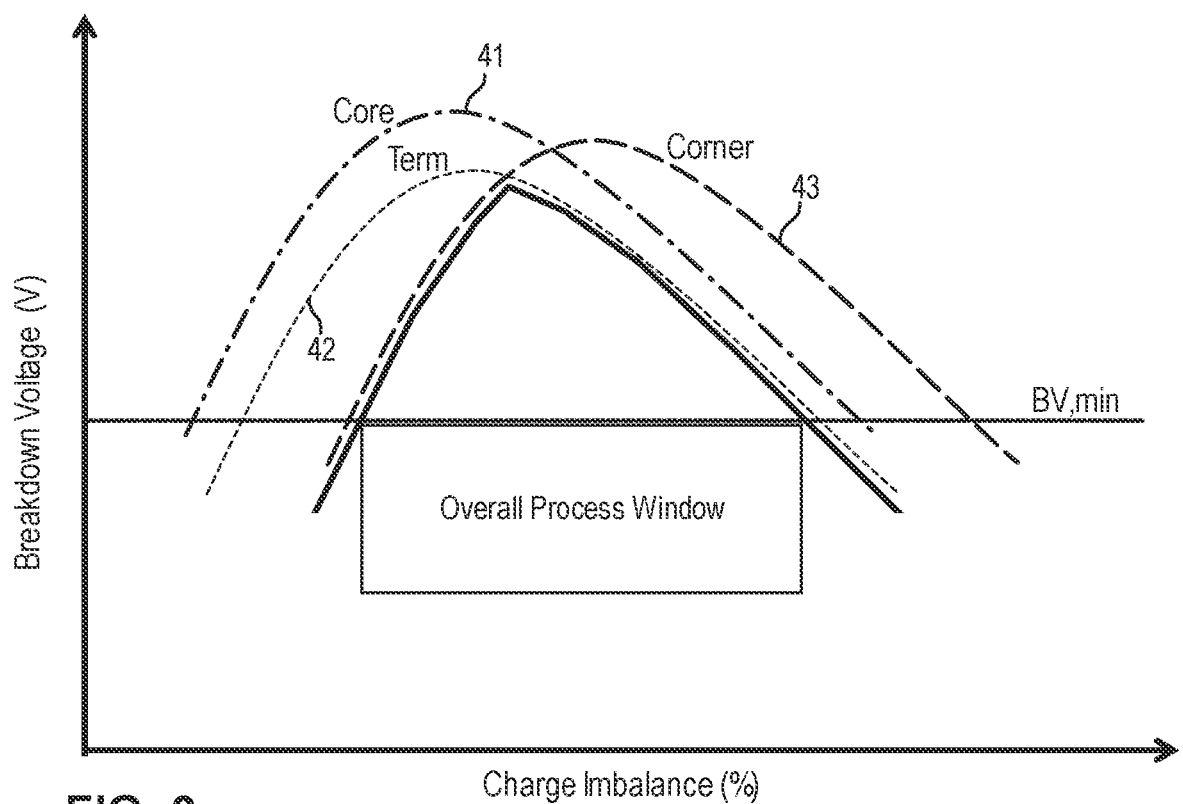
FIG. 3 is a plot illustrating the manufacturing process window of a conventional superjunction power semiconductor device in one example.

In particular, each region of the power semiconductor device may have its own manufacturing process window for charge balance and the process windows for the different regions may not overlap. FIG. 3 is a plot illustrating the manufacturing process window of a conventional superjunction power semiconductor device in one example. Referring to FIG. 3, curves 41, 42 and 43 illustrate the breakdown voltage versus charge balance characteristics of the core region, the edge termination region, and the corner region, respectively. A good manufacturing window is defined as the curve region having a breakdown voltage greater than the minimum allowable breakdown voltage BV,min. In a conventional power semiconductor device, the core region may have a good manufacturing window (curve 41) in one location while the corner region (curve 43) and edge termination region (curve 42) may have good manufacturing windows in other locations. The overall manufacturing process window for the power semiconductor device is determined by the overlap of the process windows for the core, corner and edge termination regions that is above the minimum breakdown voltage BV, min. Alternately, the overall process window is defined by the curve region where the core, corner, edge termination regions all have a breakdown voltage greater than the minimum allowable breakdown voltage BV,min. When the process windows for the core region is displaced from the corner or edge termination regions, the overall process window for the semiconductor device may become narrowed. In some cases, the overall process window can be limited by the charge balance in the corner region and the edge termination region. In some cases, the overall process window for the device is determined by the corner or edge termination regions where the corner or edge termination regions have lower breakdown voltage as compared to the core region.

A narrowed overall process window is undesirable due to the potential for yield loss from manufacturing process variations. That is, manufacturing process variations may result in the overall process window being captured only some of the time (e.g. 60%) during fabrication. Yield loss results when manufacturing process variations cause the fabrication process to drift out of the overall process window.

Furthermore, the robustness of the semiconductor power device may be affected when the breakdown of the device occurs in the corner or edge termination regions instead of in the core region. Breakdown occurring in the core region is preferred for unclamped inductive switching (UIS). When the breakdown occurs in the corner or edge termination regions due to lower breakdown voltages as compared to the core region, the UIS rating of the power semiconductor device may become degraded.

According to embodiments of the present invention, a semiconductor power device incorporating superjunction structures includes a termination region constructed with a higher breakdown voltage than that of the core region. Increasing the breakdown voltage of the corner and edge termination regions widens the process windows for the termination region so that the overall process window for the semiconductor device is no longer limited by the process window of the termination region. Widening the manufacturing process window for the termination region remove the termination region from being a yield limiting factor for the power semiconductor device. Fabrication process variations are better captured by the widened overall process window, leading to enhanced yield. Furthermore, the semiconductor device constructed with a higher breakdown voltage in the termination region will ensure that breakdown occurs primarily in the core region which is preferred for robustness. The UIS performance is improved and is more consistent by limiting avalanche breakdown only in the active cells in the core region.

Figure 4:
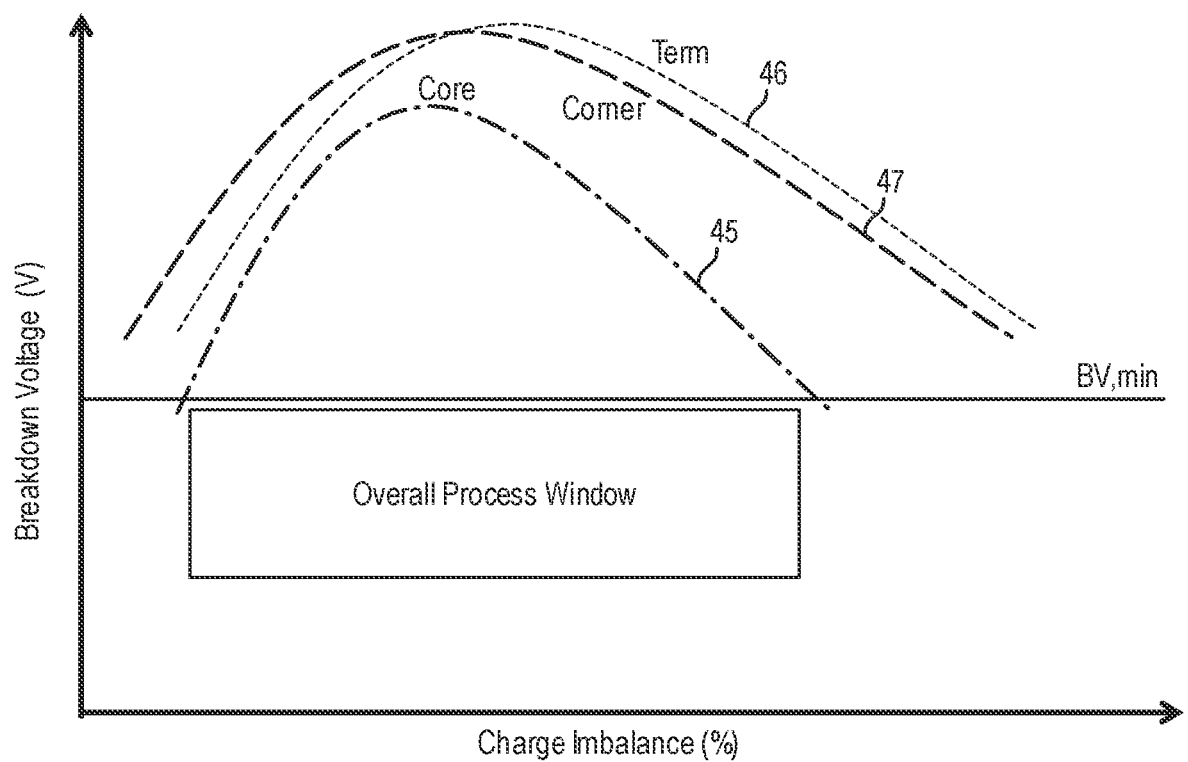
FIG. 4 is a plot illustrating the manufacturing process window of a superjunction power semiconductor device in embodiments of the present invention.

FIG. 4 is a plot illustrating the manufacturing process window of a superjunction power semiconductor device in embodiments of the present invention. Referring to FIG. 4, curves 45, 46 and 47 illustrate the breakdown voltage versus charge balance characteristics of the core region, the edge termination region, and the corner region, respectively. A good manufacturing window is defined as the curve region having a breakdown voltage greater than the minimum allowable breakdown voltage BV,min. More specifically, a good manufacturing process window is defined as the fabrication process conditions for fabricating regions of the semiconductor device to have a breakdown voltage greater than a minimum allowable breakdown voltage BV, min. The overall process window for the power semiconductor device is defined by the region where all three regions (core, corner, edge termination) have a breakdown voltage greater than the minimum allowable breakdown voltage BV,min.

In the power semiconductor device of the present invention, the breakdown voltage characteristics for the edge termination region (curve 46) and the corner region (curve 47) are increased to be greater than that of the core region (curve 45). Accordingly, the overall process window of the power semiconductor device is determined only by the breakdown characteristics of the core region. The power semiconductor device is thus provided with a widened overall process window which improves the manufacturing yield. Furthermore, the power semiconductor device is made more robust by limiting the breakdown to the core region, not at the termination region.

Figure 5:
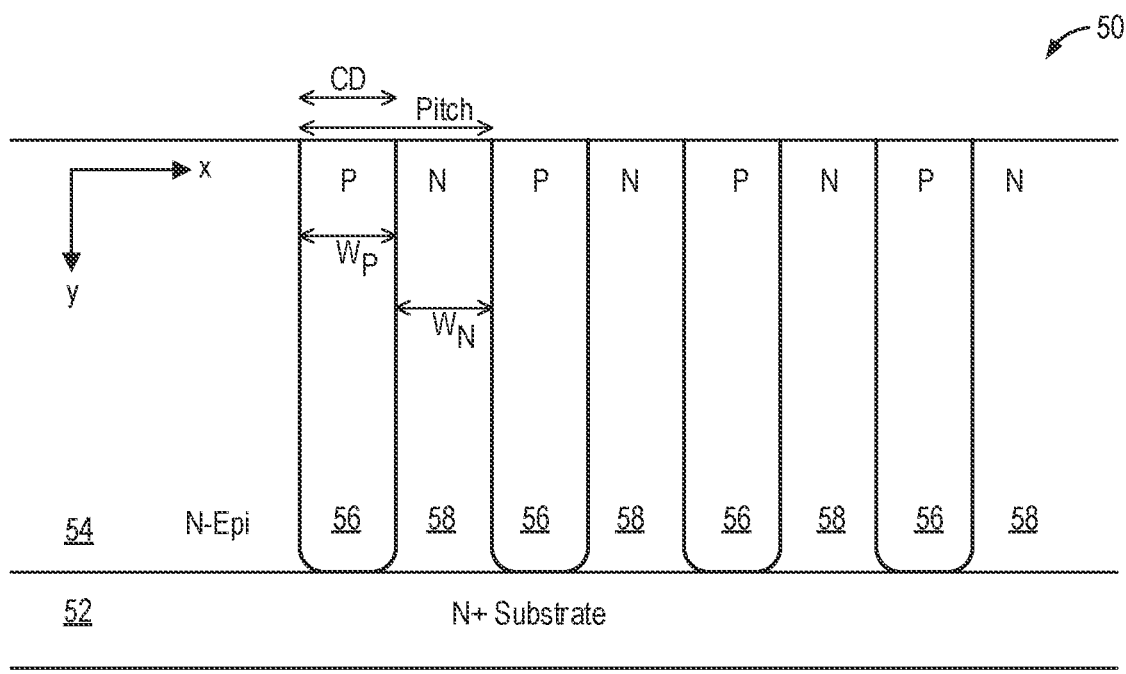
FIG. 5 is a cross-sectional view of a superjunction structure that can be incorporated in the power semiconductor device in embodiments of the present invention.

FIG. 5 is a cross-sectional view of a superjunction structure that can be incorporated in the power semiconductor device in embodiments of the present invention. Referring to FIG. 5, a superjunction structure 50 is formed on a semiconductor substrate 52 which is a heavily doped N-type substrate (N+ substrate) in the present embodiment. An N-type epitaxial layer (N-Epi) 54 is formed on the N+ substrate 52. The N-Epi layer 54 is more lightly doped than the N+ substrate 52. P-type doped columns 58 are formed in the N-Epi layer 54. The P-type doped columns (or "P-columns") 56 are formed to have a given critical dimension (CD) and a given pitch. The critical dimension establishes the width of the P-columns 56, denoted as $W_P$. The pitch determines the spacing of the P-columns in the N-Epi layer 54. The N-Epi layer 54 between two adjacent P-columns 56 forms the alternating N regions of the superjunction structure and is referred herein as the N-columns 58. The critical dimension together with the pitch establishes the width of the N-columns 58, denoted as $W_N$. In the present embodiment, by forming P-type doped columns 56 in the N-Epi layer 54 at regular intervals determined by the pitch, alternating P-type and N-type thin semiconductor regions are formed as the superjunction structure.

In the embodiment shown in FIG. 5, the superjunction structure is shown as having a straight sidewall. The depiction of the superjunction structure in FIG. 5 is illustrative only and is not intended to be limiting. In actual implementations, the superjunction structure may have sidewalls that are strictly straight but may contain slight curvature. For example, a method for forming the superjunction structure of FIG. 5 may involve forming successive epitaxial layer and performing implantation at each epitaxial layer to form the doped columns.

Figure 6:
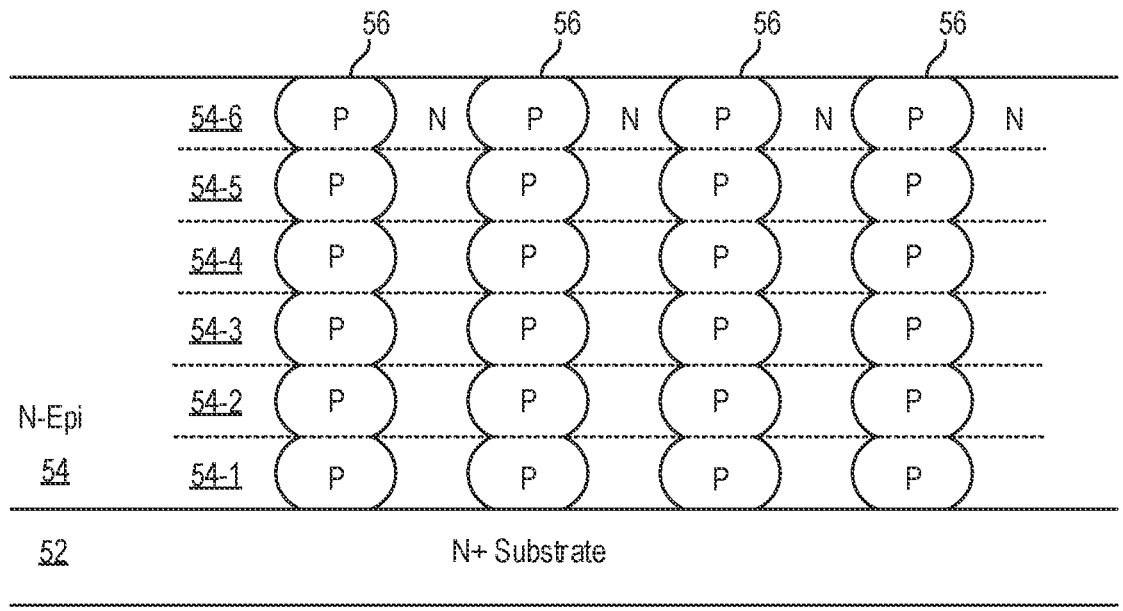
FIG. 6 is a cross-sectional view illustrating a method of forming the superjunction structure of FIG. 5 in some examples.

FIG. 6 is a cross-sectional view illustrating a method of forming the superjunction structure of FIG. 5 in some examples. Referring to FIG. 6, the fabrication method may form a first N-type epitaxial layer 54-1 on the N+ substrate 52. Masking of the N-type epitaxial layer 54-1 is carried out to define regions for receiving the P-type implant. Ion implantation using P-type dopants is then performed to form P-type doped regions. Then, a second N-type epitaxial layer 54-2 is formed on the first N-type epitaxial layer 54-1. Masking and ion implantation is performed again to form P-type doped regions on the previously formed P-type doped regions. The method repeats by forming successive N-type epitaxial layers and masking and implanting the P-type doped regions. After the last epitaxial layer 54-6 is formed and implantation is performed, the semiconductor device is annealed. After annealing, the P-type columns 56 are formed in the N-Epi layer 54 to form alternating N and P thin semiconductor regions. As thus formed, the P-columns 56 may have a wavy sidewall from the successive epitaxial and implantation process. In the present description, the idealized depiction of the P-columns shown in FIG. 5 will be used to simplify the description. It is understood the P-columns of the superjunction structure may contain sidewall features not critical to the practice of the present invention.

It is noted that it is possible to make a superjunction device in which the N-type and P-type doping is reversed relative to that described above with respect to FIGS. 5 and 6. For example, N-columns could be formed in a P-type epitaxial layer to provide charge balance in superjunction device active cells or for termination. To generically refer to both possible types column structures used in superjunction devices, the terms first conductivity type and second conductivity type are sometimes used to refer to the different dopant types (i.e., P-type and N-type).

Returning to FIG. 5, as thus constructed, the superjunction structure 50 includes P-columns 56 and N-columns 58 having a given column charge. In the present description, the term "column charge" refers to the amount of charge at a given location along the Y-axis of the P or N column. In other words, column charge refers to the amount of charge in a slice of the P or N column. As shown in FIG. 5, the x-axis is the direction parallel to the major surface of the semiconductor body while the y-axis is the direction perpendicular to the major surface of the semiconductor body.

The column charge for the P-columns $Q_P$ is given as:

$$Q_P = \int_0^{W_P} N_A(x) \cdot dx$$

where $N_A$ denotes the doping concentration of the P-type dopants.

The column charge for the N-columns $Q_N$ is given as:

$$Q_N = \int_{W_P}^{W_N} N_D(x) \cdot dx$$

where $N_D$ denotes the doping concentration of the N-type dopants.

Fabrication process variations that may impact the process window includes variation in the critical dimension of the implantation mask, causing variations in the width of the doped columns thus formed, and variations in the implantation dose and variations in the epitaxial layer doping level. All these process variations may result in charge imbalance in the superjunction structure thus formed.

In constructing a superjunction power semiconductor device, the superjunction structure 50 is used in the active cell region as well as in the termination region. In embodiments of the present invention, a superjunction power semiconductor device includes a first superjunction structure for the active cell region configured to optimize the device performance and a second superjunction structure for the termination region configured to have high breakdown voltage. In particular, the second superjunction structure for the termination region is constructed to have a breakdown voltage greater than the breakdown voltage of the active cell region.

The breakdown voltage of the superjunction structure is a function of the column charge in the P and N columns and is also a function of the grading of the P and N columns. In embodiments of the present invention, the superjunction structure for the termination region is formed with reduced column charge or reduced sidewall grading or both in order to increase the breakdown voltage and improve the robustness of the power semiconductor device thus formed.

Reduced Column Charge

In the superjunction structure of FIG. 5, the breakdown voltage is a function of the column charge in the P-columns 56 and N-columns 58. When the column charge is high, the breakdown voltage will decrease but the on resistance (Rds-on) is also lowered. A lower on-resistance is preferred for the active cell region where the active transistor device is formed. Therefore, the superjunction structure for the active cell region is formed using a column charge that optimizes the on resistance Rds-on at the expense of lower breakdown voltage.

However, in normal operation, the termination regions, including most parts of the corner and all of edge termination, do not contribute to current conduction when the semiconductor device is turned on. The corner or edge termination regions are merely used to mitigate the electric field at the termination of the active cells and to prevent premature breakdown. Accordingly, embodiments of the present invention exploit the inactive nature of the termination region to configure the termination region using superjunction structures with reduced column charge which increases the breakdown voltage. Although, the on resistance in the termination region is also increased with reduced column charge, the increased on resistance dose not impact the normal device operation as the termination region is not active during normal device operation. In other words, while higher on resistance is not desirable for the active transistor cells of the semiconductor device, the higher on resistance in the termination region is inconsequential to the performance of the semiconductor device.

Figure 7:
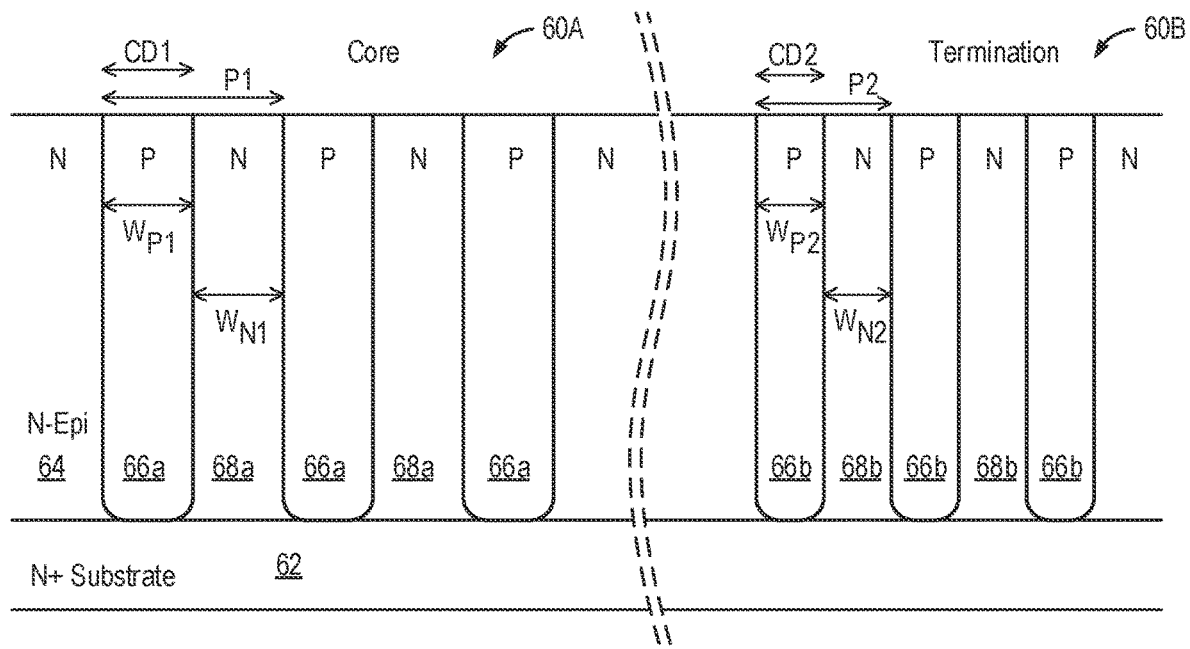
FIG. 7 is a cross-sectional view of superjunction structures for the core region and the termination region that can be incorporated in a power semiconductor device in embodiments of the present invention.

FIG. 7 is a cross-sectional view of superjunction structures for the core region and the termination region that can be incorporated in a power semiconductor device in embodiments of the present invention. Referring to FIG. 7, a semiconductor device is constructed using a first superjunction structure 60A for the active cell region (core region) and using a second superjunction structure 60B for the termination region. In the present embodiment, both superjunction structures 60A and 60B are formed in an N-type epitaxial layer (N-Epi) 64 formed on a N+ substrate 62. The first superjunction structure 60A includes P-columns 66a formed in the N-Epi layer 64. The N-Epi layer 64 between two adjacent P-columns 66a forms the N-columns 68a. The P-columns 66a are formed using a critical dimension CD1 and a pitch P1. As a result, P-columns 66a with a column width $W_{P1}$ and N-columns 68a with a column width $W_{N1}$ are formed.

In the second superjunction structure 60B for the termination region, the column charge is to be reduced in order to raise the breakdown voltage. In embodiments of the present invention, the second superjunction structure 60B includes P-columns 66b formed in the N-Epi layer 64. The N-Epi layer 64 between two adjacent P-columns 66b forms the N-columns 68b. The P-columns 66b are formed using a critical dimension CD2 and a pitch P2. As a result, P-columns 66b with a column width $W_{P2}$ and N-columns 68b with a column width $W_{N2}$ are formed.

In one embodiment, to reduce column charge in the termination region, the dimensions of the P-columns and N-columns of the second superjunction structure are reduced. This will reduce the column charge of both P and N columns while maintaining the charge balance. In one example, the critical dimension of the P-columns 66b is made smaller than the critical dimension of the P-columns 66a of the active cell region. That is, CD2 is made smaller than CD1. The P-column dimension is reduced and the P-column charge is thus reduced. For example, CD2 can be 80% of CD1. Meanwhile, the pitch of the P-columns 66b is also made smaller than the pitch of the P-columns 66a of the active cell region. That is, pitch P2 is made smaller than pitch P1. Reducing the P-column pitch has the effect of reducing the N-column dimension which reduces the N-column charge. For example, P2 can be 80% of P1.

In yet another embodiment, to reduce column charge in the termination region, the doping level of the P-columns and N-columns of the second superjunction structure are reduced. In one example, the doping levels of the P-columns 66b and the N column 68b can be made lower than the doping levels of the P-columns 66a and N column 68a of the active cell region. Meanwhile, the doping level of the N-Epi layer 64 for the termination region is also made lower than the doping level of the N-Epi layer 64 in the core region. For example, the doping level of the P-columns 66b can be made 80% the doping level of the P-columns 66a and the doping level of the N-Epi layer 64 in the termination region can be made 80% the doping level of the N-Epi layer 64 in the core region. In one example, the doping level is reduced by reducing the N-type implant dose of the epitaxial layer and the P-type implant dose of the P-column implant. In some embodiments, the P-column critical dimension and the P-column pitch can be individually adjusted to maintain charge balance.

In some embodiments, the column charge in the termination region is reduced by reducing the physical dimension of the P and N columns, such as by reducing the critical dimension and the pitch of the P-columns, and by reducing the doping levels of the P-columns and the N-columns. In this manner, charge balance is maintained in the termination region while the breakdown voltage is increased. The breakdown voltage in the second superjunction structure for the termination region is increased and is greater than the breakdown voltage of the active cell region.

In one example, the first superjunction structure for the active cell region is formed using CD1=1 µm and a pitch P1=8 µm to realize a sufficiently low on resistance for the active cells. The second superjunction structure for the termination region is formed using CD2=0.8 µm and a pitch P2=6.8 µm to realize 20% lower column charge and therefore higher breakdown voltage. As thus configured, the breakdown voltage of the termination region becomes higher than the breakdown voltage of the active cell region. Although the termination region now has a higher on resistance, the device performance is not impacted as the termination region is inactive during normal device operation. In one example, the breakdown voltage of the first superjunction structure is 650V and the breakdown voltage of the second superjunction structure is 740V. As thus configured, the power semiconductor device will be constructed so that the breakdown voltage of the core region is always the lowest for the power semiconductor device.

As described above, the column charge of a superjunction structure refers to the amount of charge in a slice of the P or N column. In embodiments of the present invention, the column charge can be reduced at only a part or a portion of the superjunction columns. For example, the column charge reduction needs to be applied to at least 10% of each column. Furthermore, the column charge reduction can be applied to any part of the columns, at the top, middle or lower portion of the columns. In some embodiments, the critical dimension, pitch, or doping level adjustment to be applied to reduce the column charge can be applied to only a portion of each P-column 66b. In one example, 25% column charge reduction is applied to 50% of each P-column 66b in the termination region.

Figure 8:
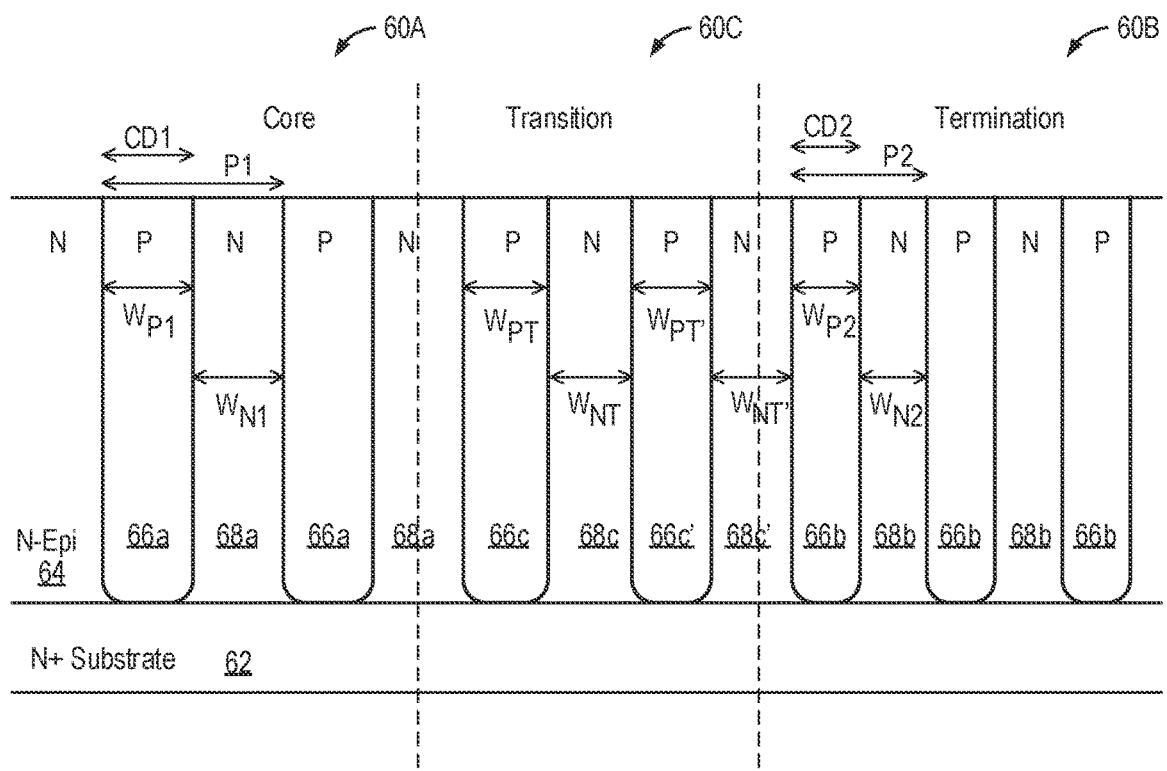
FIG. 8 is a cross-sectional view of superjunction structures for the core region and the termination region that can be incorporated in a power semiconductor device in alternate embodiments of the present invention.

In embodiments of the present invention, the power semiconductor device includes a transition region between the core region and the termination region to gradually change the P-column critical dimension and pitch between the core region and the termination region. FIG. 8 is a cross-sectional view of superjunction structures for the core region and the termination region that can be incorporated in a power semiconductor device in alternate embodiments of the present invention. Referring to FIG. 8, the semiconductor device includes a transition region 60c formed between the core region and the termination region. The transition region 60c including P-columns 66c formed in the N-Epi layer 64. The P-columns 66c are formed with critical dimension and pitch that gradually changes from CD1 and P1 of the core region to CD2 and P2 of the termination region. As a result, the column width of the P and N columns gradually decrease from $W_{P1}$ and $W_{N1}$ to $W_{P2}$ and $W_{N2}$, respectively. In one example, the transition region may include critical dimension values that changes as follows: 1 µm to 0.95 µm to 0.9 µm to 0.85 µm to 0.8 µm. In some examples, the transition region may include 3-5 columns and may occupy less than 1% of the device area.

Reduced Column Grading

In some cases, superjunction structure is formed using graded or slanted sidewalls for the P or N columns to reduce avalanche breakdown and to improve UIS rating. In this manner, the P-type doping concentration is higher near the top surface while the N-type doping concentration is higher near the bottom of the semiconductor body. This graded profile improves the robustness of the device. Embodiments of the present invention exploit the inactive nature of the termination region to construct termination region using superjunction structures with reduced column grading to increase the breakdown voltage. In this manner, the termination region has a breakdown voltage greater than the active cell region to improve the overall process window of the semiconductor device thus formed.

Figure 9:
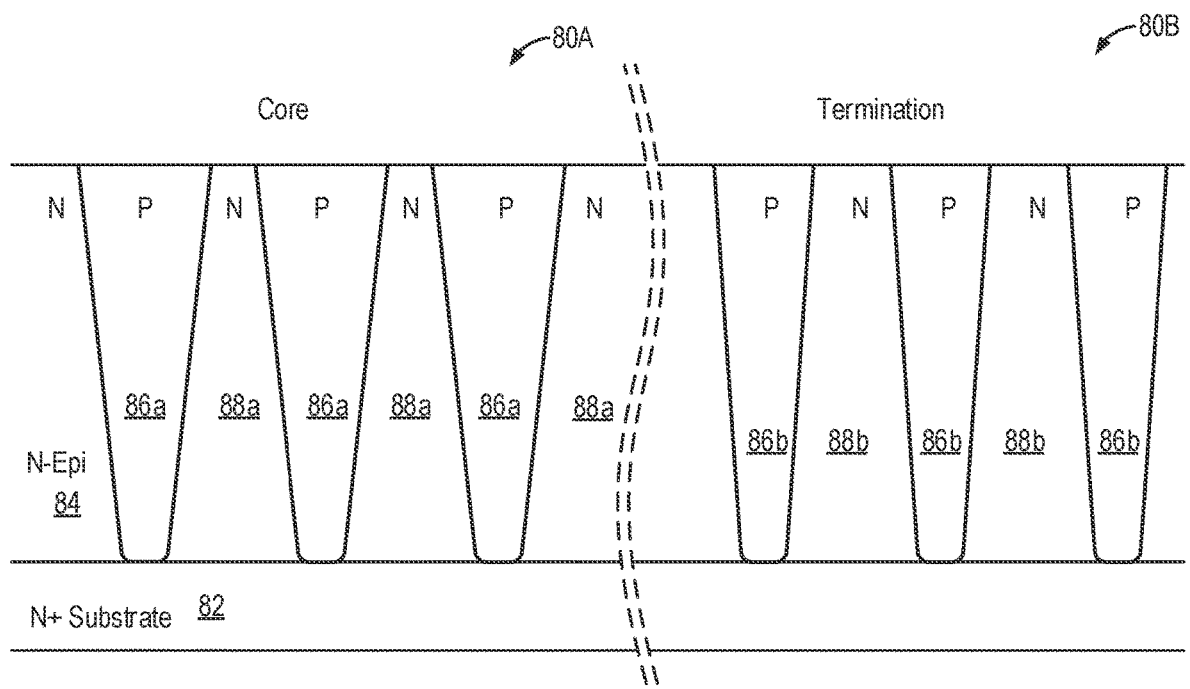
FIG. 9 is a cross-sectional view of superjunction structures for the core region and the termination region that can be incorporated in a power semiconductor device in embodiments of the present invention.

FIG. 9 is a cross-sectional view of superjunction structures for the core region and the termination region that can be incorporated in a power semiconductor device in embodiments of the present invention. Referring to FIG. 9, a semiconductor device is constructed using a first superjunction structure 80A for the active cell region (core region) and using a second superjunction structure 80B for the termination region. In the present embodiment, both superjunction structures 80A and 80B are formed in an N-type epitaxial layer (N-Epi) 84 formed on a N+ substrate 82. The first superjunction structure 80A includes P-columns 86a formed in the N-Epi layer 84. The N-Epi layer 84 between two adjacent P-columns 86a forms the N-columns 88a. The P-columns 86a are formed with slanted sidewalls where the sidewalls have a first grading.

In the second superjunction structure 80B for the termination region, the breakdown voltage is to be increased by reducing the column sidewall grading. In embodiments of the present invention, the second superjunction structure 80B includes P-columns 86b formed in the N-Epi layer 84. The N-Epi layer 84 between two adjacent P-columns 86b forms the N-columns 88b. The P-columns 86b are formed with slanted sidewalls where the sidewalls have a second grading.

To increase the breakdown voltage in the termination region, the sidewall grading of the P-columns 86b is made smaller. That is, the second grading is smaller than the first grading. Charge balance is maintained while the breakdown voltage is increased in the second superjunction structure for the termination region. In one example, the sidewall grading of the P-columns 86b is 10% less than the sidewall grading of the P-columns 86a.

In some embodiments, the column grading for the termination region is reduced by adjusting the column critical dimension, the column pitch, or the column doping levels, as will be described in more detail below.

Figure 10:
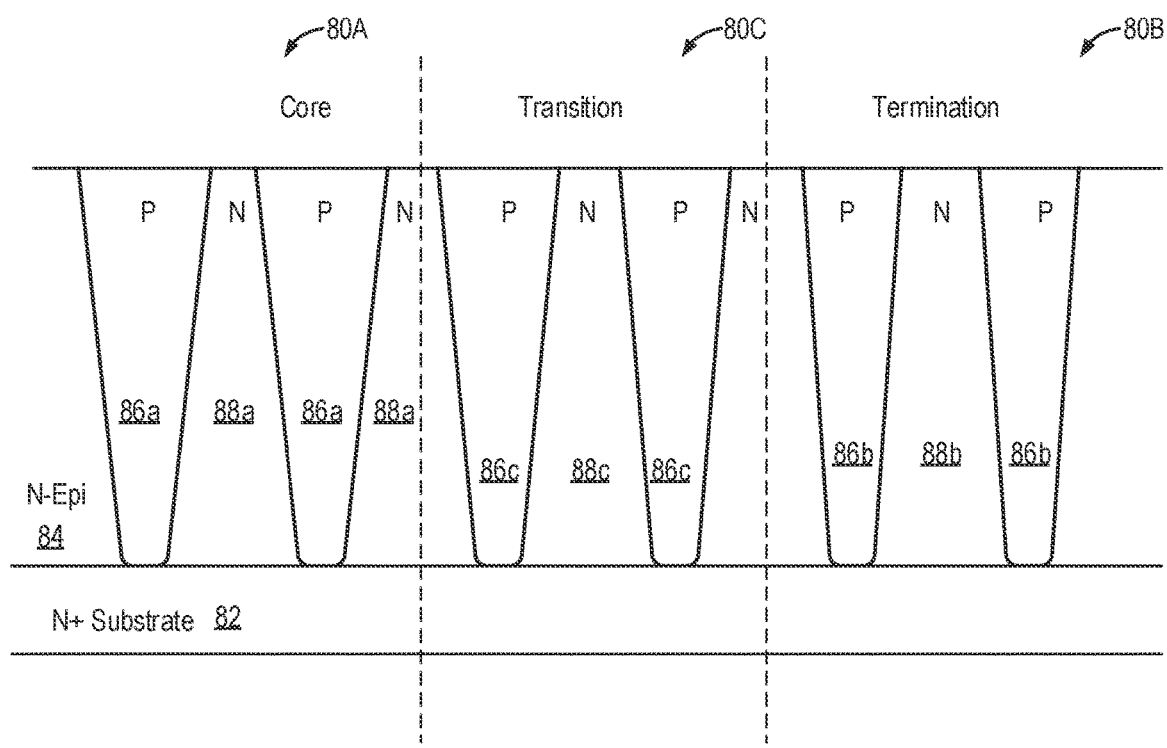
FIG. 10 is a cross-sectional view of superjunction structures for the core region and the termination region that can be incorporated in a power semiconductor device in alternate embodiments of the present invention.

In embodiments of the present invention, the power semiconductor device includes a transition region between the core region and the termination region to gradually change the P-column sidewall grading between the core region and the termination region. FIG. 10 is a cross-sectional view of superjunction structures for the core region and the termination region that can be incorporated in a power semiconductor device in alternate embodiments of the present invention. Referring to FIG. 10, the semiconductor device includes a transition region 80c formed between the core region and the termination region. The transition region 80c including P-columns 86c formed in the N-Epi layer 84. The P-columns 86c are formed with a sidewall grading that gradually changes from the first grading of the core region to the second grading of the termination region.

Figure 11:
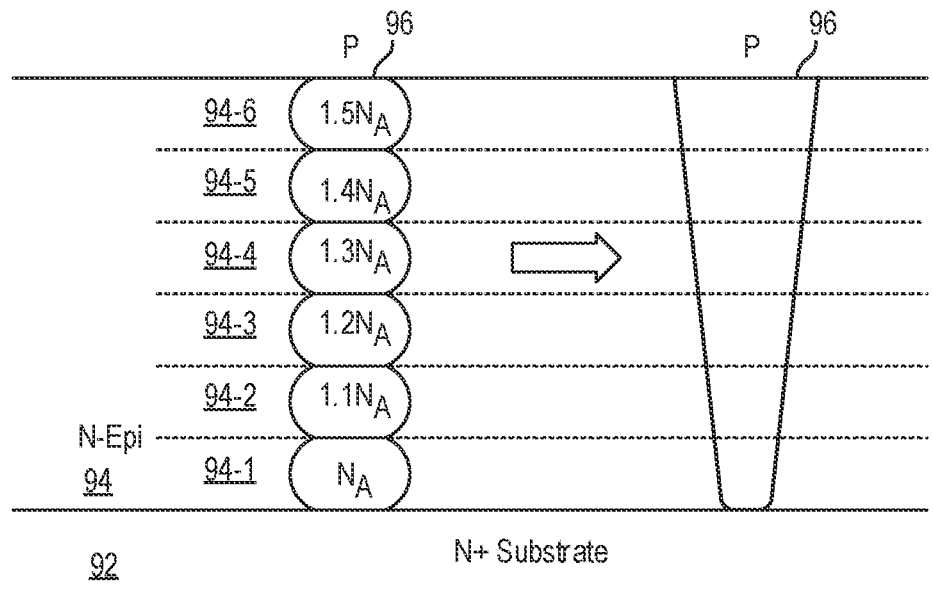
FIG. 11 illustrates a first method for forming a superjunction structure with slanted sidewall in some examples.

Various methods can be used to form slanted sidewalls in the superjunction structure. FIG. 11 illustrates a first method for forming a superjunction structure with slanted sidewall in some examples. Referring to FIG. 11, a P-column 96 is formed by ion implantation into successively formed N-Epi layer 94, where the P-type implant dose is successively increased. For example, the first implantation into N-Epi layer 94-1 uses an implant dose of $N_A$. The second implantation into N-Epi layer 94-2 uses an implant dose of $1.1N_A$. The third implantation into N-Epi layer 94-3 uses an implant dose of $1.2N_A$. The process continues until the last implantation into the N-Epi layer 94-6 uses an implant dose of $1.5 N_A$. The same critical dimension is used for all the P-type dopant implantation. After annealing, the P-column 96 with a graded profile (slanted sidewall) having a given grading is formed as dopants from the more heavily implant dose will spread out more during the annealing process than dopants from a lower implant dose.

Figure 12:
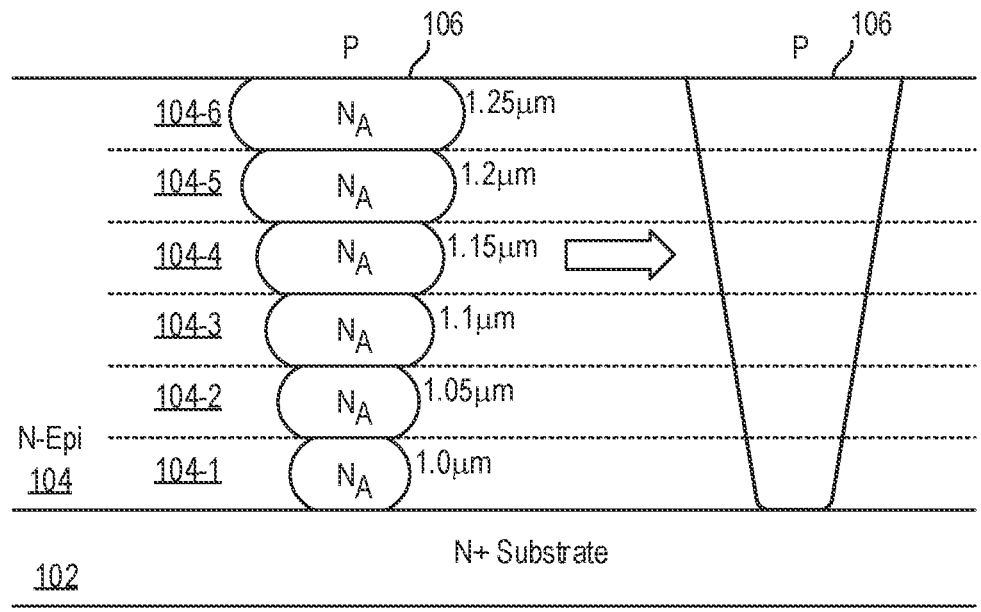
FIG. 12 illustrates a second method for forming a superjunction structure with slanted sidewall in some examples.

FIG. 12 illustrates a second method for forming a superjunction structure with slanted sidewall in some examples. Referring to FIG. 12, a P-column 106 is formed by ion implantation into successively formed N-Epi layer 104, where the P-type implant dose is kept the same while the critical dimension for the dopant implantation is increased. For example, the first implantation into N-Epi layer 104-1 uses an implant dose of $N_A$ with a CD of 1.0 μm. The second implantation into N-Epi layer 104-2 uses an implant dose of $N_A$ with a CD of 1.05 μm. The third implantation into N-Epi layer 104-3 uses an implant dose of $N_A$ with a CD of 1.1 μm. The process continues until the last implantation into the N-Epi layer 104-6 uses an implant dose of $N_A$ with a CD of 1.25 μm. After annealing, the P-column 106 with a graded profile (slanted sidewall) having a given grading is formed by the increasing CD of the P-type implant.

In one embodiment of the present invention, the superjunction structure for the termination region can be made with reduced grading by adjusting the critical dimension of the P-type implant into successive epitaxial layer. That is, in the second method shown in FIG. 12, reduced column grading can be realized by reducing the amount of critical dimension increase at each epitaxial layer. By keeping the critical dimension increase smaller or by not increasing the critical dimension at all at each successive epitaxial layer, the resulting superjunction column will have reduced column grading or no grading at all.

In another embodiment, the superjunction structure for the termination region can be made with reduced grading by adjusting the doping level of the P-type implant into successive epitaxial layer. That is, in the first method shown in FIG. 11, reduced column grading can be realized by reducing the amount of implant dose increase at each epitaxial layer. By keeping the implant dose increase smaller or by not increasing the implant dose at all at each successive epitaxial layer, the resulting superjunction column will have reduced column grading or no grading at all.

In the transition region, the critical dimension, the doping level or the pitch can be changed gradually to reduce the column grading from the first grading of the active cell region to the second grading of the termination region.

In embodiments of the present invention, the superjunction structures described above for the core region and the termination region may be used to construct various types of transistor devices, including vertical or lateral superjunction MOSFET devices. In one embodiment, the vertical MOSFET device of FIG. 1 may be constructed using the superjunction structures described herein with the termination region being constructed to have a higher breakdown voltage than that of the active cell region.

In the above descriptions, the superjunction structure is formed using P-type doped columns in an N-type epitaxial layer. The embodiments described above is illustrative only and not intended to be limiting. In other embodiments, the superjunction structure can be formed using N-type doped columns in P-type epitaxial layer to provide charge balance in superjunction device active cells or for termination.

The above detailed descriptions are provided to illustrate specific embodiments of the present invention and are not intended to be limiting. Numerous modifications and variations within the scope of the present invention are possible. The present invention is defined by the appended claims.

What is claimed is:

1. A method for forming a superjunction power semiconductor device, the method comprising:
   providing a semiconductor substrate of a first conductivity type;
   forming a plurality of epitaxial layers of the first conductivity type on the semiconductor substrate, the plurality of epitaxial layers including a first epitaxial layer to a last epitaxial layer;
   subsequent to each epitaxial layer being formed, implanting dopants of a second conductivity type, opposite the first conductivity type, and having a respective implant dose to form a first group of implanted regions in a first region of the respective epitaxial layer, and implanting dopants of the second conductivity type and having a respective implant dose to form a second group of implanted regions in a second region of the respective epitaxial layer, each implanted region of the first and second groups having a planar dimension and being positioned in alignment with respective implanted regions in the respective first and second groups formed in other epitaxial layers; and
   subsequent to the plurality of epitaxial layers being formed with the implanted regions, annealing the first to last epitaxial layers to form a plurality of columns of the second conductivity type having slanted sidewalls across the first to last epitaxial layers, the plurality of columns including a first group of columns formed by the implanted regions of the first group and having a first grading and a second group of columns formed by the implanted regions of the second group and having a second grading, the second grading being less than the first grading.

2. The method of claim 1, wherein annealing the first to last epitaxial layers to form the plurality of columns of the second conductivity type comprises:
   forming the plurality of columns having increasing planar dimensions from the first epitaxial layer to the last epitaxial layer.

3. The method of claim 1, wherein the implant dose used for each epitaxial layer increases from the first epitaxial layer to the last epitaxial layer, and at each epitaxial layer, the implant dose used for the implanted regions of the first group is greater than the implant dose used for the implanted regions for the second group.

4. The method of claim 3, wherein the implanted regions of the first group has a first planar dimension in a first direction, the first direction being parallel to a planar surface of the semiconductor substrate, across the plurality of epitaxial layers, and the implanted regions of the second group has a second planar dimension in the first direction across the plurality of epitaxial layers, the first planar dimension being greater than the second planar dimension.

5. The method of claim 3, wherein the implant doses used for each epitaxial layer increases by at least 10% of the implant dose of the previous epitaxial layer.

6. The method of claim 1, wherein each of the implanted regions of the first and second groups has the planar dimension in a first direction, the first direction being parallel to a planar surface of the semiconductor substrate, the planar dimension of the implanted regions for each epitaxial layer increases from the first epitaxial layer to the last epitaxial layer, and at each epitaxial layer, the planar dimensions of the implanted regions of the first group is greater than the planar dimensions of the implanted regions of the second group.

7. The method of claim 6, wherein implanting dopants of the second conductivity type comprises:
   in each epitaxial layer, implanting dopants of the second conductivity type and having a first implant dose to form the first group of implanted regions and implanting dopants of the second conductivity type and having a second implant dose to form the second group of implanted regions, the first implant dose being greater than the second implant dose.

8. The method of claim 6, wherein the planar dimensions of the implanted regions in the first and second groups for each epitaxial layer increases by at least 5% from the planar dimensions of the respective implanted regions of the previous epitaxial layer.

9. The method of claim 1, wherein the first region comprises an active cell region and the second region comprises a termination region encircling the active cell region.

10. The method of claim 1, wherein the semiconductor substrate comprises a heavily doped semiconductor substrate of the first conductivity type and the plurality of epitaxial layer comprise epitaxial layers of the first conductivity type and being more lightly doped than the semiconductor substrate.

11. The method of claim 1, wherein the first conductivity type comprises N-type conductivity and the second conductivity type comprises P-type conductivity.

* * * * *